United States Patent [19]
Dornfest et al.

[11] Patent Number: 5,680,013
[45] Date of Patent: Oct. 21, 1997

[54] CERAMIC PROTECTION FOR HEATED METAL SURFACES OF PLASMA PROCESSING CHAMBER EXPOSED TO CHEMICALLY AGGRESSIVE GASEOUS ENVIRONMENT THEREIN AND METHOD OF PROTECTING SUCH HEATED METAL SURFACES

[75] Inventors: Charles N. Dornfest, Fremont; John M. White, Hayward; Craig A. Bercaw, Sunnyvale; Hiroyuki Steven Tomosawa, San Jose; Mark A. Fodor, Los Gatos, all of Calif.

[73] Assignee: Applied Materials, Inc., Santa Clara, Calif.

[21] Appl. No.: 213,880

[22] Filed: Mar. 15, 1994

[51] Int. Cl.⁶ .................................................. H01L 21/30
[52] U.S. Cl. ..................... 315/111.21; 156/345 P; 118/723 E; 118/723 R; 213/231.31
[58] Field of Search ................... 204/298.34, 298.01, 204/298.14, 298.15; 156/345 P, 345 PW, 345 WH; 216/71; 118/723 E, 723 R; 315/111.21; 313/231.31

[56] References Cited

U.S. PATENT DOCUMENTS

| | | | |
|---|---|---|---|
| 4,427,516 | 1/1984 | Levinstein et al. | 204/192 E |
| 4,491,496 | 1/1985 | Laporte et al. | 156/345 |
| 4,526,644 | 7/1985 | Fujiyama et al. | 156/345 |
| 4,612,432 | 9/1986 | Sharp-Geisler | 219/121 PG |
| 4,623,417 | 11/1986 | Spencer et al. | 156/345 |
| 4,693,777 | 9/1987 | Hazano et al. | 156/345 |
| 4,793,975 | 12/1988 | Drage | 422/186.05 |
| 5,223,113 | 6/1993 | Kaneko et al. | 204/298.33 |
| 5,236,151 | 8/1993 | Hagle et al. | 244/117 A |
| 5,252,892 | 10/1993 | Koshiishi et al. | 315/111.81 |
| 5,272,417 | 12/1993 | Ohmi | 315/111.21 |
| 5,366,585 | 11/1994 | Robertson et al. | 216/67 |

FOREIGN PATENT DOCUMENTS

| | | |
|---|---|---|
| 0 115 970 | 1/1984 | European Pat. Off. |
| 56-87667 | 7/1981 | Japan . |
| 62-47131 | 2/1987 | Japan . |
| 62-113761 | 5/1987 | Japan . |
| 63-076430 | 6/1988 | Japan . |

*Primary Examiner*—Robert Pascal
*Assistant Examiner*—Arnold Kinkead
*Attorney, Agent, or Firm*—John P. Taylor

[57] ABSTRACT

Non-bonded ceramic protection is provided for metal surfaces in a plasma processing chamber, particularly heated metal electrode surfaces, in a plasma processing chamber, to prevent or inhibit attack of the heated metal surfaces by chemically aggressive species generated in the plasma during processing of materials, without bonding the ceramic material to the metal surface. In accordance with the invention the ceramic protection material comprises a thin cover material which is fitted closely, but not bonded, to the heated metal. This form of ceramic protection is particularly useful for protecting the surfaces of glow discharge electrodes and gas distribution apparatus in plasma process chambers used for processing semiconductor substrates to form integrated circuit structures. The particular ceramic material used to provide the desired protection from the gaseous species generated by the plasma are selected from the group consisting of aluminum nitride, crystalline aluminum oxide, magnesium fluoride, and sintered aluminum oxide.

30 Claims, 6 Drawing Sheets

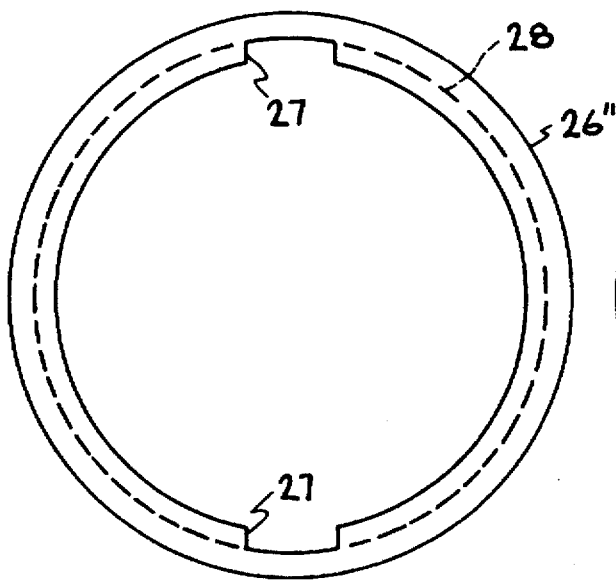
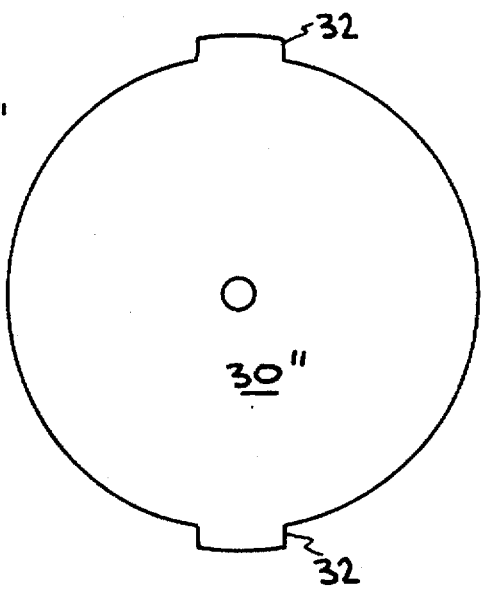
FIG. 7   FIG. 8
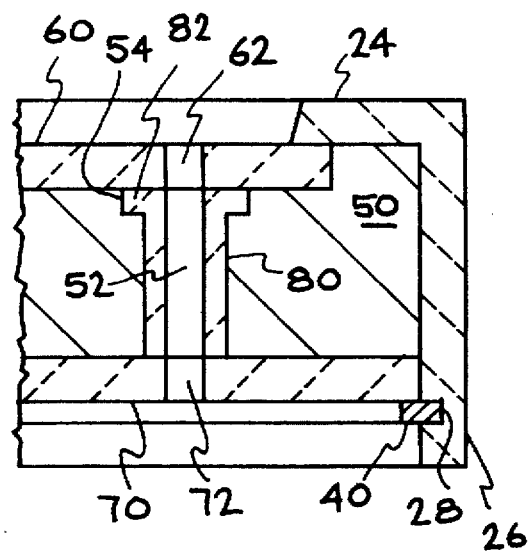
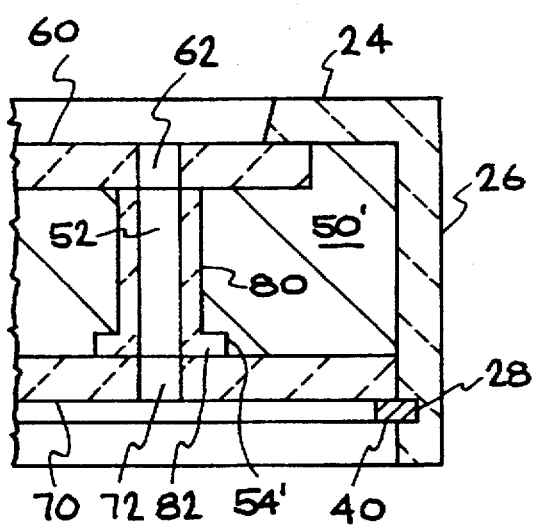
FIG. 9   FIG. 10

1

CERAMIC PROTECTION FOR HEATED METAL SURFACES OF PLASMA PROCESSING CHAMBER EXPOSED TO CHEMICALLY AGGRESSIVE GASEOUS ENVIRONMENT THEREIN AND METHOD OF PROTECTING SUCH HEATED METAL SURFACES

BACKGROUND OF THE INVENTION

1. Field of the Invention

This invention relates to protection of heated metal surfaces of a plasma processing chamber. More particularly, it relates to a plasma processing chamber having metal electrodes covered with particular ceramic materials and shapes to protect the metal electrodes from attack by gaseous species formed in the plasma during processing of a semiconductor substrate and a method of operating such a plasma processing chamber while protecting such metal electrodes from attack by such gaseous species.

2. Description of the Related Art

Critical metal components which may be exposed to chemically aggressive environments in a plasma processing chamber during the processing of heated semiconductor substrates therein include, for example, the susceptor (wafer support) electrode and the showerhead (gas distribution) electrode. Aluminum is generally preferred as the metal for such electrodes since it is a relatively low cost material and the most widely accepted metal for semiconductor processing.

The conventional wisdom, for protecting such aluminum electrode surfaces in plasma enhanced chemical vapor deposition (PECVD) or etching apparatus, is to use a relatively inert ceramic material, such as aluminum oxide anodization, as a protection layer bonded to the aluminum metal surfaces which may be heated to temperatures of about 200°–500° C. during such processing of semiconductor substrates. Such anodization sustains high temperature and the aggressive glow discharge excited halogen species which are typical of the required process conditions used, for example, in etching processes.

Other forms of coating of chamber walls or electrodes in plasma processing apparatus are also known. For example, Levenstein et al. U.S. Pat. No. 4,427,516 describes the coating of top plates of wafer-holding assemblies with silicon to minimize contamination during etching. LaPorte et al. U.S. Pat. No. 4,491,496 discloses the coating of metal surfaces of an etching chamber by flame spraying $Al_2O_3$ and the coating of the lower electrode (which is at RF potential) with either $Al_2O_3$ or tungsten. Fujiyama et al. U.S. Pat. No. 4,526,644 teaches the coating of a stainless steel structure with a metal which does not readily form a fluoride when exposed to a fluorine-containing plasma. Sharp-Geisler U.S. Pat. No. 4,612,432 discloses coating an Aluminum RF electrode with a consumable layer of silicon to avoid contamination of a wafer by sputtering of the aluminum by the plasma. In Japan Document 56-87667, electrode surfaces are coated with carbon or organic materials such as Teflon or polyester to prevent formation of a deposit on a silicon sample during etching. In Japan Document 62-47131, the outer periphery of a wafer support electrode is coated with an insulator in an RIE apparatus to prevent an electric field from concentrating at the periphery of the wafer.

However, aluminum (the material of choice in construction of plasma processing equipment), has a much larger thermal expansion coefficient than most suitable protective coating materials, including ceramics such as aluminum oxide. Consequently, ceramic protection layers (having characteristically low tensile strength) fail by cracking as the heated and intimately bonded aluminum metal expands with increasing temperature. Thus, even when coated or anodized aluminum components are formed using best known manufacturing methods, they eventually fail in such aggressive environments, especially when thermal cycling is required, resulting in both expense and undesired down time for replacement of the failed components.

Prior art attempts at solving this thermal expansion problem have included using low thermal expansion coefficient metal alloys such as iron-nickel-cobalt alloys, e.g., KOVAR as a substitute for aluminum. However, the iron, nickel, and cobalt contained in such an alloy pose a contamination risk in semiconductor device processing. Hazano et al. U.S. Pat. No. 4,693,777 discloses the use of linings over the inner surface of the stainless steel walls of an etch chamber to prevent iron or nickel contamination. The linings are preferably made of aluminum, but may be carbon or silicon carbide. Japan Document 62-113761 describes lining the inner surface of a vacuum vessel with a carbon film to form a slightly gas emitting surface which suppresses the emission of gas from the vessel as a whole. However, with any of these approaches, when aluminum is not used as the chamber and electrode material, it is difficult to guarantee that the iron, nickel, chromium, or cobalt usually found in the substitute materials will never migrate to semiconductor regions where defects would be formed.

It would, therefore, be highly desirable to be able to use a compatible metal such as aluminum as the electrode material in plasma processing apparatus, while providing a surface thereon which is capable of withstanding attack by aggressive species generated in the plasma without incurring the prior art thermal mismatch between such aluminum electrodes and protective ceramic surfaces thereon.

SUMMARY OF THE INVENTION

The invention comprises non-bonded ceramic protection to metal surfaces, particularly heated metal electrode surfaces, in a plasma processing chamber, to prevent or inhibit attack of the heated metal surfaces by chemically aggressive species generated in the plasma during processing of materials, without bonding the ceramic material to the metal surface. In accordance with the invention the ceramic protection material comprises a thin cover material which is fitted closely, but not bonded to the heated metal. This form of ceramic protection is particularly useful for protecting the surfaces of glow discharge electrodes and gas distribution apparatus in plasma process chambers used for processing semiconductor substrates to form integrated circuit structures.

BRIEF DESCRIPTION OF THE DRAWINGS

FIG. 7 is a bottom view of the ceramic sleeve showing another embodiment of the mechanism used to secure the ceramic materials to the metal susceptor electrode, comprising a slotted annular groove.

FIG. 8 is a bottom view of a ceramic disc with tabs which can be received in the slotted annular groove of FIG. 7.

FIG. 9 is a fragmentary vertical cross-sectional view of a portion of the embodiment of FIG. 1 showing a protective ceramic sleeve fitted into a finger lift hole normally provided in the metal susceptor electrode to receive a lift finger used to remove a semiconductor substrate from the susceptor.

FIG. 10 is a fragmentary vertical cross-sectional view of another embodiment of the protective ceramic sleeve structure shown in FIG. 9, with the flange of the protective ceramic sleeve received in an enlarged counterbore in the bottom surface of the metal susceptor electrode.

DETAILED DESCRIPTION OF THE INVENTION

Figure 1:
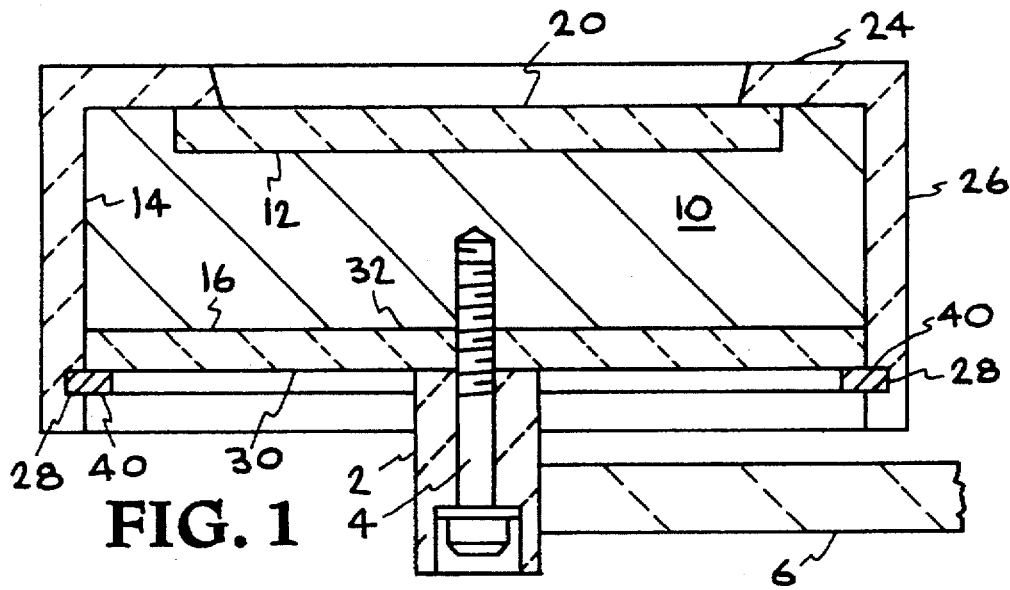
FIG. 1 is a vertical cross-sectional view of one embodiment of a non-bonded ceramic cover for a metal susceptor electrode of a plasma processing apparatus.

In accordance with the invention non-bonded ceramic protection is provided for metal surfaces, particularly heated metal electrode surfaces, in a plasma processing chamber, to prevent or inhibit attack of the heated metal surfaces by chemically aggressive species generated in the plasma during processing of materials. The ceramic protection material is applied and secured against the metal surfaces without bonding the ceramic material to the metal surfaces to avoid cracking of the ceramic protection material by due to mismatch in thermal expansion rates of the metal and the ceramic materials. Thus, the ceramic protection material comprises a thin cover material which is fitted closely, but not bonded to the heated metal.

This form of ceramic protection is particularly useful for protecting the surfaces of glow discharge electrodes and gas distribution apparatus in plasma process chambers used for processing semiconductor substrates to form integrated circuit structures. The invention permits bare or anodized aluminum electrodes to last for longer periods of time when exposed to operating temperatures in excess of 200° C. Above this temperature bonded ceramic coatings usually crack due to thermal expansion rate mismatch, resulting in attack of exposed aluminum through such cracks by the plasma species. Use of this apparatus and this method of operating a plasma processing chamber results in a reduced residue formation and further inhibits the sensitivity of the electrodes to such residue formation, since any unintended creation or addition of further residues (which are always dielectrics) on the surface of the covered electrodes does not substantially change the electrical characteristics of the plasma processing as much, since the metal electrode surfaces already are covered with dielectric/insulation material prior to any such residue formation.

An additional benefit of the protective ceramic covering over the susceptor is that the susceptor electrode surface, in combination with a semiconductor wafer on the surface, presents a more uniform distribution of impedance to the plasma when the electrode is protected by the ceramic covering.

Providing such a ceramic covering over the peripheral portions of the susceptor which are still exposed, even when a semiconductor wafer is resting on the susceptor, is of particular importance both for uniform impedance and protection of the susceptor against corrosion.

a. The Ceramic Protection Material

The ceramic protection material to be fitted over the heated metal surfaces should comprise a ceramic material possessing good thermal shock resistance, good thermal conductivity, good wear rate when exposed to plasma environments, and good dielectric properties. The ceramic material should also exhibit good fabrication properties, that is, be capable of being handled in thin sheets, e.g., about 125 micrometers ($\mu m$) to about 12.5 mm (about 5 mils to about 500 mils) without breakage. By good thermal shock resistance is meant that a room temperature substrate may be placed on a susceptor heated to a temperature as high as 500° C. without cracking the ceramic material covering the heated susceptor. By good thermal conductivity is meant a thermal conductivity of at least 100 watts/meter-degree centigrade (W/m-C). By good dielectric properties is meant that the ceramic insulation should be capable of blocking DC, while allowing passage of RF frequency voltages to the underlying metal electrode.

The preferred ceramic material which exhibits all of the above-mentioned properties is aluminum nitride (AlN). Aluminum nitride has the advantages of demonstrated chemical resistance to reactive halogen environment (glow discharge activated fluorine); high thermal conductivity (100–200 W/m-C); and high thermal shock resistance, e.g., accommodating a room temperature silicon substrate being placed on an aluminum nitride plate heated to about 400°–500° C. Other materials which may be used and which exhibit satisfactory levels of all of the previously mentioned properties include crystalline aluminum oxide (sapphire), magnesium fluoride, sintered aluminum oxide, and magnesium oxide.

The thickness of the ceramic material may be as little as 125 $\mu m$ (5 mils), with even smaller thicknesses permissible from a standpoint of chemical protection, as well as electrical properties. The lower limit of thickness, however, will usually be governed by the handling properties of the ceramic material during fabrication of the various shapes to be described below, as well as the installation of the ceramic materials over the metal parts to be protected. Typically, the thickness of the ceramic protection material will be about 500 μm (20 mils).

Upper thickness limitations of the ceramic protection material, while generally not as important, will be controlled by the RF impedance of the ceramic material, the lowered thermal conductivity, and the cost of the material. A typical maximum thickness of the material would, therefore, not be expected to exceed about 12.5 mm (500 mils).

The preferred material, aluminum nitride, comprises sintered aluminum nitride, which may contain a small amount, i.e., from about 0.5 to about 2 wt. %, of a sintering agent such as yttrium oxide or magnesium oxide. To avoid formation of aluminum oxynitride, which would degrade the thermal conductivity of the aluminum nitride, the aluminum nitride should be sintered in a non-oxidizing atmosphere, preferably a substantially oxygen-free nitrogen atmosphere. The particle size of the aluminum nitride particles, prior to sintering, should preferably range from about 2 μm to about 20 μm. Except for the presence of the aforementioned sintering agent or agents, each of the ceramic materials should have a purity of at least about 90 wt. %, preferably about 99 wt. %, and most preferably about 99.9 wt. %.

b. The Fabricated Shapes of the Ceramic Protection Material

Turning now to FIG. 1, a preferred embodiment of the invention is illustrated wherein a metal susceptor is surrounded by ceramic materials without the ceramic material being bonded to the metal susceptor. The metal materials being illustrated, such as the susceptor or showerhead electrodes, will be referred to herein as aluminum, while the protecting ceramic will be referred to as aluminum nitride, by way of illustration, and not of limitation. In FIG. 1, an aluminum susceptor 10 used for supporting a semiconductor substrate in a plasma processing chamber is shown comprising a solid cylinder having an upper surface with a central circular cutout portion 12 of a depth and diameter approximately equal to a circular aluminum nitride ceramic disc 20 which is received in cutout portion 12 of susceptor 10. Susceptor 10 is shown generally attached to a central susceptor support 2 by a threaded bolt 4. Support 2 is, in turn, connected to a wall of the plasma process chamber (not shown) by a support arm 6. Support 2 and support arm 6 may be formed of ceramic material, thereby obviating the need for further protection against the chemical species generated in the processing chamber by the plasma.

Ceramic disc 20 is urged against susceptor 10 by an aluminum nitride circular sleeve or collar 24 having a depending skirt 26 thereon of the same material. Skirt 26 has an inner diameter (ID) just slightly larger than the outer diameter (OD) of cylindrical aluminum susceptor 10 to allow for thermal expansion of the aluminum susceptor. By just slightly larger is meant about 1–2%. As shown the length of aluminum nitride skirt 26 is slightly longer than the thickness of aluminum susceptor 10 so that the entire outer surface of sidewall 14 of susceptor 10 is covered by aluminum nitride skirt 26. Coverage by aluminum nitride skirt 26 of the entire aluminum sidewall 14 of susceptor 10 is important since plasma generated in prior an plasma processing chambers tends to flow to the edge of the susceptor, rather than the central portion of the susceptor where the semiconductor substrate is resting, because the impedance path through the semiconductor substrate is higher. By protecting aluminum sidewall 14 of susceptor 10 with the aluminum nitride insulation material, the impedance will be more balanced.

As seen in FIG. 1, the ID of collar 24 is smaller than the OD of aluminum nitride disc 20 to provide an overlap over disc 20 to thereby further inhibit species generated by a plasma from reaching the underlying aluminum susceptor through the intersection between collar 24 and disc 20.

Figure 2:
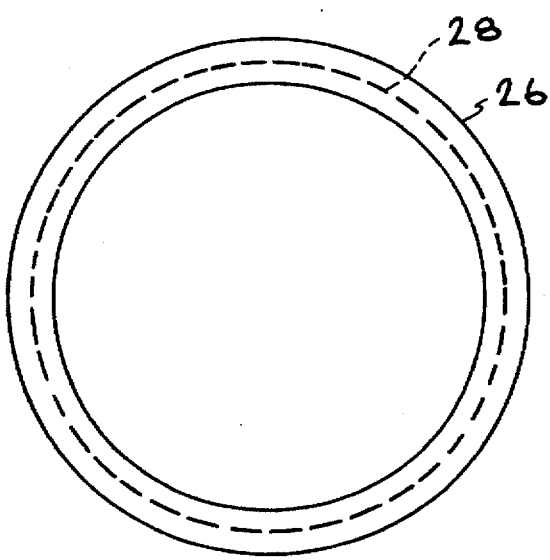
FIG. 2 is a bottom view of a portion of the structure of FIG. 1, showing the annular groove formed in the ceramic sleeve to provide securement of the ceramic sleeve to the metal susceptor.

Still referring to FIG. 1, the metal undersurface 16 of aluminum susceptor 10 is also preferably protected by a ceramic cover in the form of an aluminum nitride disc 30 having an upper surface 32 and a lower surface 34. Disc 30 has an OD slightly smaller than the ID of aluminum nitride skirt 26. To retain the assembly of upper aluminum nitride disc 20, aluminum nitride collar 24 and skirt 26, and lower aluminum nitride disc 30 together, an annular groove or slot 28, as shown in both FIGS. 1 and 2, is provided on the inner surface of skirt 26 at a spacing on skirt 26 just below the lower surface 34 of lower disc 30.

Figure 3:
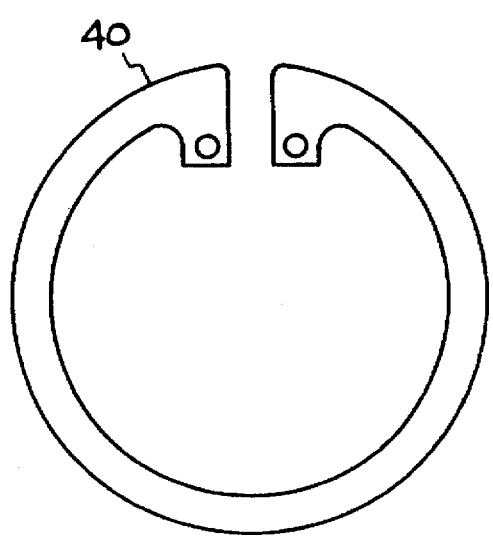
FIG. 3 is a bottom view of the snap ring shown in FIG. 1.
Figure 4:
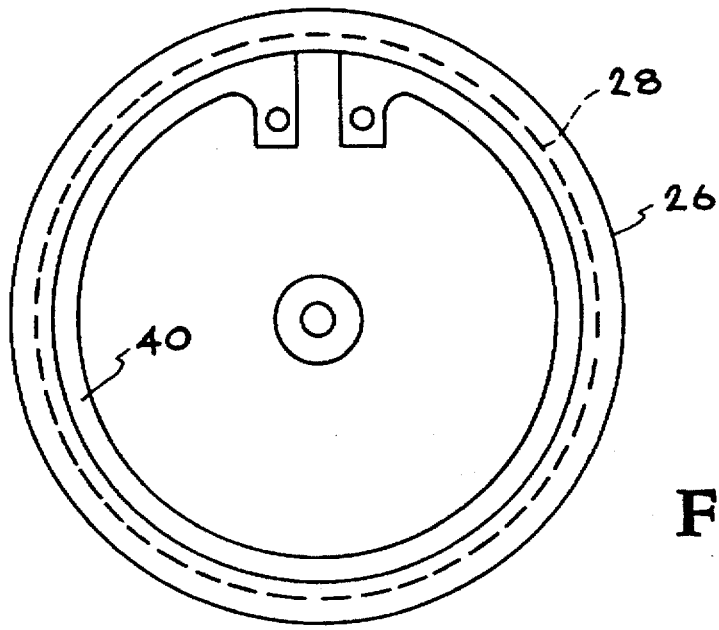
FIG. 4 is a bottom view of a portion of the structure of FIG. 1, showing the snap ring of FIG. 3 inserted in the annular groove shown in FIG. 2.

As shown in FIGS. 3 and 4, a snap ring 40, having an OD (when not in tension) slightly larger than the diameter of annular groove 28, may be inserted into groove 28 to retain the assembly of upper aluminum nitride disc 20, aluminum nitride collar 24 and skirt 26, and lower aluminum nitride disc 30 together, as shown in FIGS. 1 and 4.

Figure 1A:
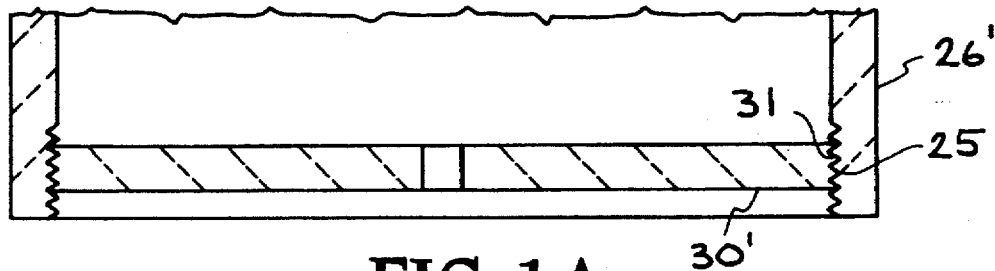
FIG. 1A is a fragmentary view of a portion of FIG. 1 showing an alternate means for securing the ceramic sleeve to the metal susceptor using threads on both the ceramic sleeve and the ceramic cover which protects the metal undersurface of the susceptor.

Referring to FIG. 1A, an alternate means is disclosed and illustrated for securing the aluminum nitride skirt to the aluminum nitride disc protecting the rear surface of metal susceptor 10. In this embodiment, skirt 26' is provided with female threads 25 adjacent the end edge of the skirt which receive matching male threads 31 provided on the end edge of modified aluminum nitride disc 30'.

Figure 5:
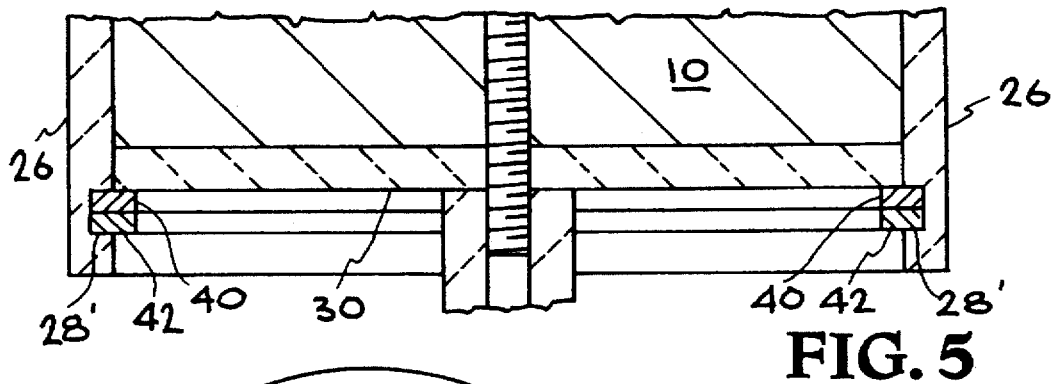
FIG. 5 is a fragmentary vertical cross-sectional view of a portion of FIG. 1 with the annular groove modified to accept two snap rings such as the snap ring shown in FIG. 3.
Figure 6:
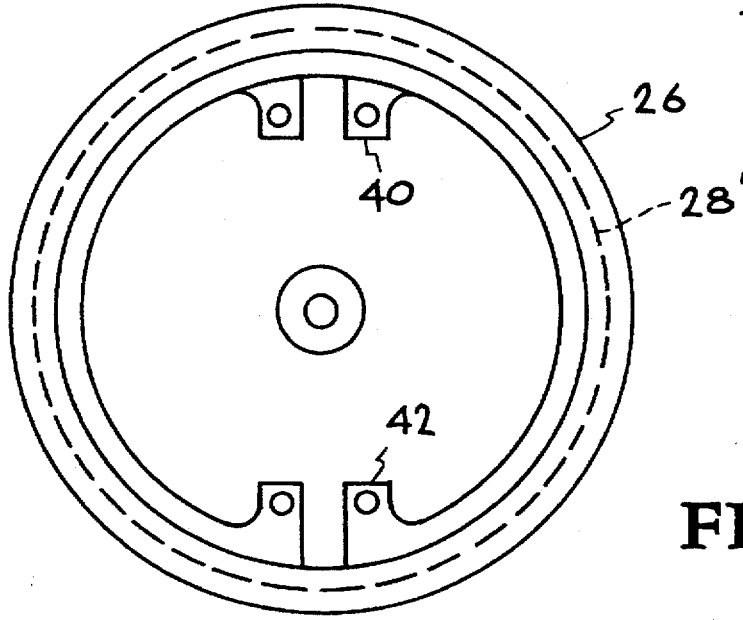
FIG. 6 is a bottom view of the embodiment of FIG. 5, showing two of the snap rings of FIG. 3 inserted in the enlarged annular groove shown in FIG. 5.

Turning to FIGS. 5 and 6, another embodiment of the means for retaining the assembly together around aluminum susceptor 10 is illustrated wherein annular groove 28' has a width sufficient to accommodate two snap rings 40 and 42. As shown in FIG. 6, the two snap rings may then be staggered so that there is no opening between the ends of the snap ring wherein the plasma species can directly reach the space between the outer edge of lower aluminum nitride disc 30 and the inner edge of skirt 26.

FIGS. 7 and 8 illustrate yet another embodiment of the means for retaining the assembly together around aluminum susceptor 10 assembly. In this embodiment, skirt 26" is provided with slots 27 in the bottom surface of skirt 26" which extend to annular groove 28 and lower aluminum nitride disc 30" is provided with corresponding tabs 32. Tabs 32 on disc 30" are then inserted into slots 27 and disc 30" is rotated to lock tabs 32 in annular groove 28.

FIG. 9 illustrates another aspect of the invention wherein finger openings 52 are formed in a circular aluminum susceptor 50 which is otherwise similar to susceptor 10. Such finger openings are normally provided in a susceptor to permit the insertion of fingers therethrough from the lower surface of the susceptor to assist in lifting the semiconductor substrate off the susceptor after processing thereon. In such case, for the fingers to properly operate, openings must be provided in both the upper and lower aluminum nitride protection discs as well. However, such openings would provide the plasma species with ingress to the exposed aluminum sidewall surfaces of the openings in aluminum susceptor 50. To prevent this, openings 62 and 72 are provided in an upper aluminum nitride disc 60 and lower aluminum nitride disc 70 of smaller diameter than openings 52 in susceptor 50. Furthermore, enlarged counterbores 54 may be provided in the upper surface of aluminum susceptor 50 coaxial with openings 52. A ceramic insert or sleeve 80, having an OD of approximately the diameter of opening 52, is inserted into opening 52. A flange 82 on sleeve 80 is fitted into counterbore 54. In this manner, the surfaces of aluminum susceptor 50 are still protected from the species generated in the plasma, despite the presence of finger openings 52 in aluminum susceptor 50.

While the embodiment of FIG. 9 may be preferred, wherein the aluminum nitride flange 82 is provided on the upper end of aluminum nitride sleeve 80, since the upper surface of susceptor 50 may be more vulnerable to attack by the plasma species, it may be preferable, in some instances, to mount aluminum nitride sleeve 80 from the bottom side of the assembly, as shown in FIG. 10. In this instance aluminum susceptor 50' will be formed with a counterbore 54' on the undersurface of susceptor 50 coaxial with opening 52. Sleeve 80 will then be inserted into opening 52 in susceptor 50' so that flange 82 thereon will slip into counterbore 54', as shown in FIG. 10. This type of construction may be preferable in those instances wherein it is found that the presence of a semiconductor substrate overlying upper aluminum nitride disc 60 provides sufficient protection from access by the plasma species from the top to openings 52 and the need to protect ingress of the plasma species to the aluminum sidewall surfaces of openings 52 in susceptor 50 from the bottom of the assembly is found to be more necessary.

Figure 11:
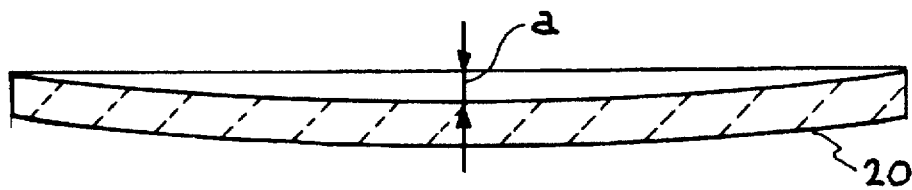
FIG. 11 is a vertical cross-sectional view of the ceramic plate portion of the ceramic cover shown in FIG. 1 which fits over the top surface of the metal susceptor electrode showing the initial concave shape of the ceramic plate which compensates for bowing or warping of the metal susceptor electrode as it heats up to operating temperature.

Referring now to FIG. 11, it will be noted that aluminum nitride disc 20 (or disc 60 of FIGS. 9 and 10) is preferably not formed flat, but is rather preferably provided with a concave surface. This is to compensate for warpage or bowing of the aluminum susceptor as it heats up, i.e., to maintain aluminum nitride disc 20 in thermal and electrical contact with aluminum susceptor 10, regardless of the temperature. When disc 20 is assembled with collar 24 in contact with the edges of disc 20, disc 20 is flexed or tensioned to lie flat on susceptor 10, as shown in FIG. 1.

The distance "a" of the depth of the center of aluminum nitride disc 20 from the plane of the edges of disc 20 (before being flexed against susceptor 10 by collar 24) will vary with the diameter of the susceptor which, in turn, may vary with the size of the semiconductor substrate being processed. For an aluminum susceptor having a diameter of 20 cm. (8 inches), i.e., for processing 200 mm. (8 inch) diameter semiconductor substrates, the value of "a" may range from about 0.1 mm to about 0.5 mm. For an aluminum susceptor having a diameter of about 12.5 cm. (5 inches), i.e., for processing 100 mm (5 inch) diameter semiconductor substrates, the value of "a" may range from about 0.1 mm to about 0.25 mm. For susceptor diameters intermediate these values, the range of "a" will be adjusted accordingly.

Figure 12:
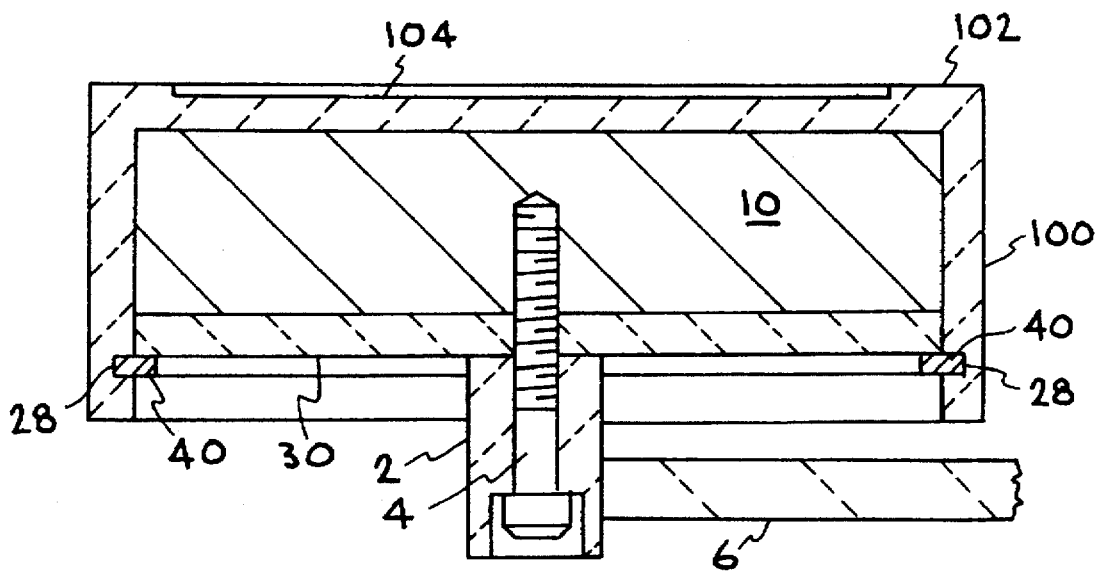
FIG. 12 is a vertical cross-sectional view of another embodiment of a non-bonded ceramic cover for the metal susceptor electrode of a plasma processing apparatus.
Figure 13:
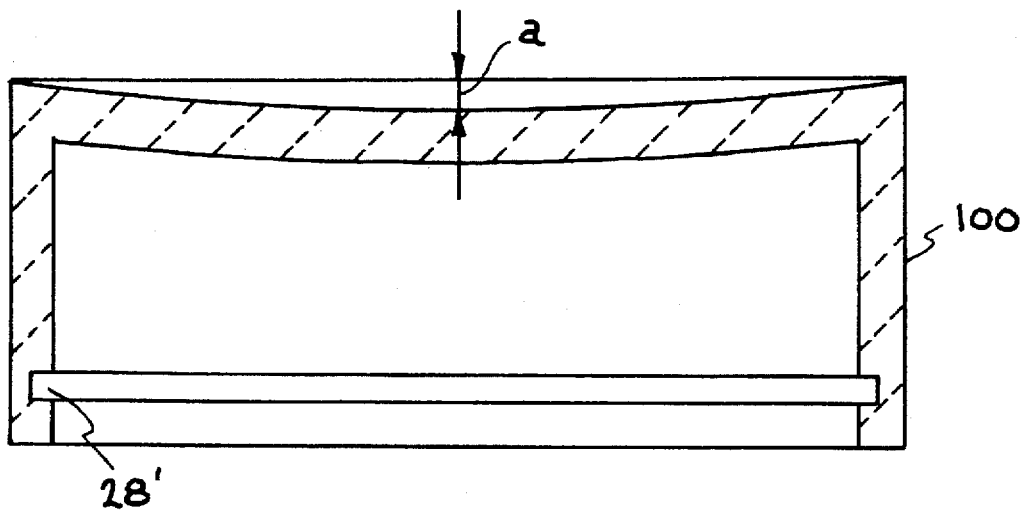
FIG. 13 is a vertical cross-sectional view of the embodiment of FIG. 11, showing the initial concave shape of the center plate portion of the ceramic protective cover which compensates for bowing or warping of the metal susceptor electrode as it heats up to operating temperature.

While the embodiment, and variations thereof, just described in FIGS. 1–11 have shown aluminum nitride disc 20 as a separate piece from aluminum nitride collar 24 and skirt 26 depending therefrom, the embodiment shown in FIGS. 12 and 13 utilizes a one piece cup-like shell 100 of aluminum nitride which eliminates the joint between disc 20 and collar 24 of the prior embodiment. While the previous embodiment illustrated in FIGS. 1–11 is easier and more economical to construct, the embodiment of FIGS. 12 and 13 provides optimum protection of the underlying aluminum susceptor from chemical attack. The front surface 102 of shell 100 may be provided with a central recess 104 to receive and retain a semiconductor substrate therein, similar to the same function of collar 24 with respect to disc 20.

In FIG. 12, shell 100 is shown secured to aluminum susceptor 10 using annular groove 28 with a single snap ring 40 therein, as in the embodiment shown in FIG. 1. It will be understood, however, that shell 100 may also be secured to susceptor 10 using the double snap ring construction of FIGS. 5 and 6 (as shown by the enlarged annular groove 28' in FIG. 13), or the slot and tab construction shown in FIGS. 7 and 8. Similar finger openings and protection for same, as that shown in FIGS. 9 and 10, may also be utilized with aluminum nitride shell 100.

Figure 14:
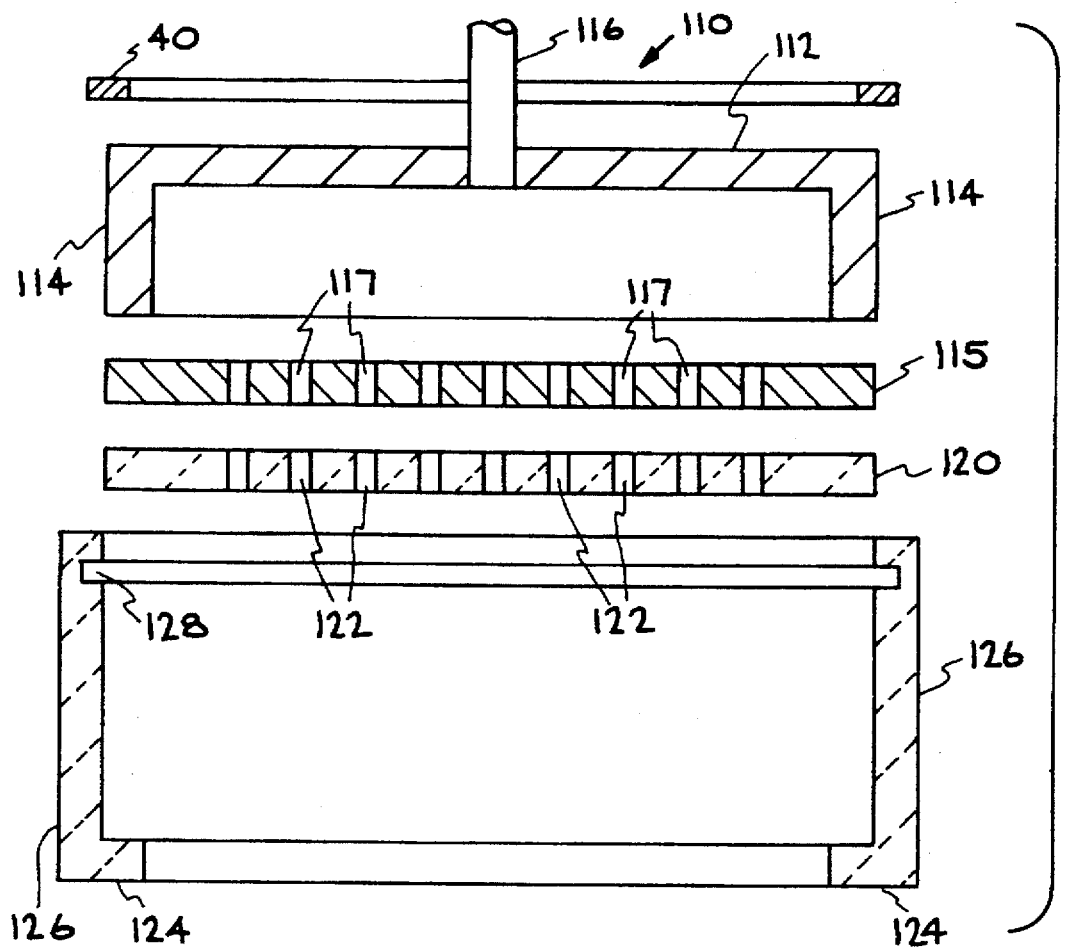
FIG. 14 is an exploded view of one embodiment of a non-bonded ceramic cover for the metal showerhead electrode of a plasma processing apparatus.

Turning now to FIG. 14, one embodiment of protecting the aluminum showerhead or anode in the plasma processing chamber is illustrated. The showerhead comprises an aluminum cup 110 having a backwall 112, a depending skirt or sidewall 114, a front plate 115, and a central inlet port 116 through which processing gases enter. Aluminum front plate 115 is provided with a series of openings through which gas flows from the showerhead into the plasma processing chamber. An aluminum nitride ceramic disc 120, having a series of openings 122 therein, in alignment with openings 117 in aluminum from plate 115, forms the front surface of the showerhead through which the process gases exit into the processing chamber. Ceramic disc 120 is secured to aluminum cup 110 by collar 124 and sleeve 126. Aluminum nitride sleeve 126 has a length greater than the length of sidewall 114 to thereby serve to protect aluminum sidewall 114 from the chemical species generated by the plasma in the processing chamber.

Collar 124 and sleeve 126 may be clamped and secured against disc 120 by the provision of an annular groove 128 on the inner surface of sleeve 126 into which a snap ring 40 is received, similarly to the previously described attachment of collar 24 and skirt 26 to susceptor 10. Protection of the outer surface of aluminum backwall 112 is not deemed to be necessary in view of the downward flow of the gases through openings 122 in ceramic disc 120. However, if necessary, a ceramic disc (not shown), having an OD slightly smaller than the ID of sleeve 126 may be used to protect the outer surface of backwall 112, similarly to the use of ceramic disc 30 to protect the rear surface of aluminum susceptor 10.

Figure 15:
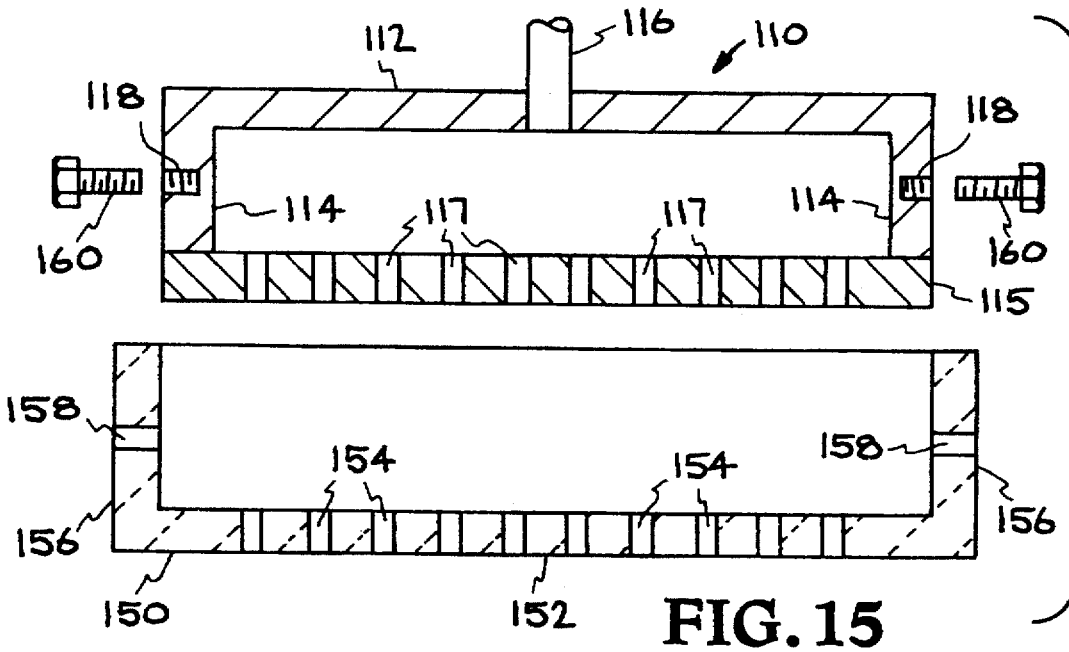
FIG. 15 is an exploded view of another embodiment of a non-bonded ceramic cover for the metal showerhead electrode of a plasma processing apparatus.

FIG. 15 shows another embodiment of the showerhead protection wherein ceramic disc 120, collar 124, and sleeve 126 are incorporated into a single aluminum nitride element 150, thereby eliminating the seam or joint between disc 120 and collar 124 of the embodiment of FIG. 14. Ceramic element 150 has a front face 152 with openings 154 therein, and a sidewall 156 having a length greater that sidewall 114 to thereby serve to shield aluminum sidewall 114.

Also shown in the embodiment of FIG. 15 is an alternate fastening means for securing ceramic protection element 200 to sidewall 114 of aluminum cup 110. In this embodiment, openings 158 are provided in ceramic sidewall 156 of element 150 for ceramic bolts 160 which are received in threaded bores 118 in sidewall 114 of aluminum cup 110. It should be noted that either the slot and snap ting securement of FIG. 14 or the ceramic bolt securement shown in FIG. 15 may be interchangeably used with either of the embodiments illustrated in FIGS. 14 and 15.

Figure 16:
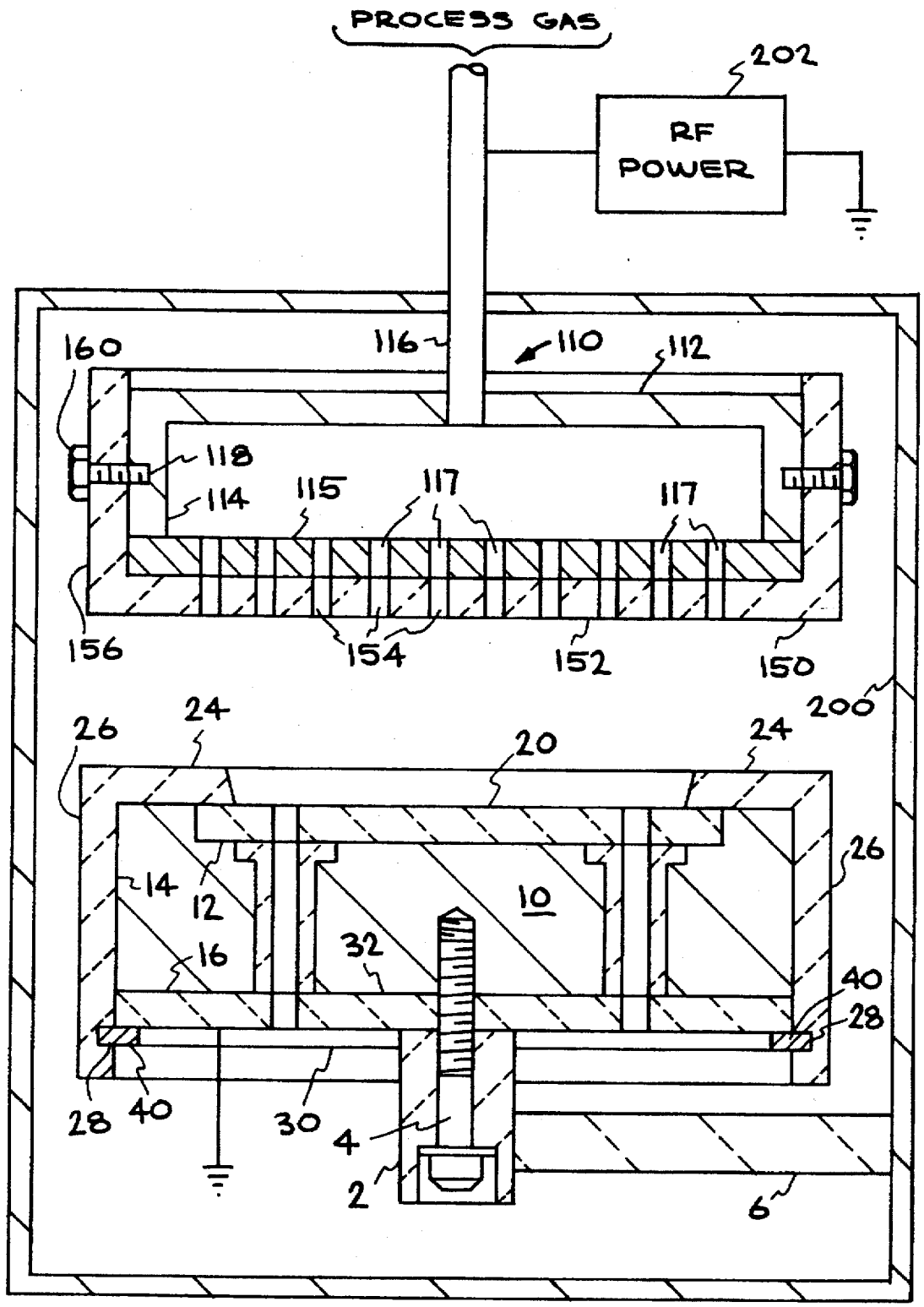
FIG. 16 is a vertical cross-sectional view of a plasma processing chamber with a metal susceptor and metal showerhead shown having their metal surfaces protected by the non-bonded ceramic material mounted thereon.

FIG. 16 shows a plasma processing chamber 200 containing a ceramic-protected aluminum susceptor, such as shown in FIG. 1, and a ceramic-protected showerhead, such as shown in FIG. 14, wherein the aluminum susceptor and the aluminum portions of the showerhead are connected to an external RF power source 202. When a reactive gas such as a halogen-containing gas, e.g., a fluorine or chlorine-containing gas, is flowed into chamber 200 through the showerhead and a plasma is established within chamber 200 between the two electrodes (the susceptor and the showerhead), reactive species are formed in the plasma from the gases flowing into the chamber through the showerhead. The presence of the non-bonded aluminum nitride ceramic material over the aluminum surfaces of the susceptor and the aluminum surfaces of the showerhead facing the plasma result in protection of such aluminum electrode surfaces from attack and erosion by the plasma constituents.

To further illustrate the practice of the invention, a test sample of 1 cm$^2$ of anodized aluminum was covered with aluminum nitride material having a thickness of about 0.51 millimeters (0.02 inches) as a protective covering. The protected aluminum sample was exposed for 500 hours (equivalent to the processing of about 20,000 wafers), in a plasma enhanced chemical vapor deposition (PECVD) chamber, to a fluorine-containing plasma formed by flowing 600 sccm of $O_2$, 600 sccm of He, 600 sccm of $C_2F_6$, and 45 sccm of $NF_3$ into the chamber while maintaining a pressure of about 4 Torr, and igniting a plasma which was maintained at a power level of about 1000 watts during the test. After the test, the anodized aluminum surface below the aluminum nitride material on the test sample was examined for corrosion and the amount of corrosion was found to be greatly reduced compared to an anodized aluminum surface not so protected.

Similar results may be obtained when covering an aluminum showerhead electrode in the manner described. Similar results may also be obtained using polycrystalline aluminum oxide (sapphire), magnesium fluoride, and magnesium oxide instead of aluminum nitride as a cover material for the susceptor and showerhead electrodes.

A series of 200 mm diameter wafers were sequentially subjected to a silicon oxide deposition using TEOS and $O_2$. Each wafer was then removed and the silicon oxide coating thereon was examined. It was found that the ceramic protection of the aluminum surfaces in the chamber did not interfere with the satisfactory deposition of silicon oxide on the wafers. Similar results were obtained when deposits of silicon nitride were made on wafers (using $SiH_4$, $NH_3$, and $N_2$ gases) followed by the same chamber cleaning procedures.

Thus, the practice of the invention results in protection of heated metal surfaces in a plasma processing chamber, and in particular heated aluminum metal electrodes in a plasma processing chamber to protect such metal surfaces from attack by species generated by the plasma in such a chamber.

Having thus described the invention what is claimed is:

1. A plasma processing chamber having aluminum surfaces including a planar aluminum surface and a sidewall aluminum surface on an aluminum susceptor therein protected from attack by species generated by a plasma generated in said chamber comprising ceramic surfaces, characterized by good dielectric properties, good thermal conductivity, and good thermal shock resistance, mounted between said aluminum surfaces and said plasma and in contact with said aluminum surfaces, but not bonded thereto, to thereby protect said aluminum surfaces while mitigating damage to said protective ceramic surfaces from thermal expansion rate mismatch between said aluminum surfaces and said ceramic surfaces, said aluminum susceptor provided with a ceramic disk on said planar aluminum surface of said aluminum susceptor, and a ceramic collar in peripheral contact with an exposed surface of said ceramic disk, said ceramic collar having a ceramic skirt depending therefrom extending over said sidewall aluminum surface of said aluminum susceptor to thereby inhibit contact of said aluminum surfaces on said aluminum susceptor by said species generated by said plasma.

2. The plasma processing chamber of claim 1 wherein said aluminum surfaces protected by said ceramic surfaces comprise anodized aluminum surfaces.

3. The plasma processing chamber of claim 1 wherein said aluminum surfaces protected by said ceramic surfaces comprise bare aluminum surfaces.

4. The plasma processing chamber of claim 1 wherein said ceramic collar and ceramic skirt thereon are further provided with fastening means to urge said ceramic collar against said ceramic disc and said aluminum susceptor.

5. The plasma processing chamber of claim 1 wherein said aluminum surfaces protected by said ceramic surfaces comprise surfaces on an aluminum showerhead in said chamber.

6. The plasma processing chamber of claim 1 wherein said aluminum surfaces are protected by ceramic surfaces selected from the group consisting of aluminum nitride, crystalline aluminum oxide, magnesium fluoride, sintered aluminum oxide, and magnesium oxide.

7. The plasma processing chamber of claim 1 wherein said plasma is a halogen gas plasma.

8. A plasma processing chamber having an aluminum susceptor therein protected from attack by species generated by a plasma generated in said chamber by ceramic surfaces mounted between said aluminum susceptor and said plasma and in contact with said aluminum susceptor but not bonded thereto, said ceramic surfaces further comprising:

a) a ceramic disk mounted on a planar surface of said aluminum susceptor, between said susceptor and said plasma;

b) a ceramic collar in peripheral contact with the exposed surface of said ceramic disk;

c) a ceramic skirt depending from said ceramic collar and extending over sidewall surfaces of said aluminum susceptor; and d) fastening means to urge said collar against said ceramic disc and said aluminum susceptor;

to thereby inhibit contact of said aluminum susceptor surfaces by said gaseous species generated by said plasma, while mitigating damage to said protective ceramic surfaces from thermal expansion rate mismatch between said aluminum susceptor and said ceramic surfaces.

9. The plasma processing chamber of claim 8 wherein said ceramic surfaces are further characterized by good dielectric properties, good thermal conductivity, and good thermal shock resistance.

10. A process for treating semiconductor substrates in a plasma processing chamber having an aluminum susceptor electrode and an aluminum showerhead electrode therein while inhibiting attack of exposed aluminum surfaces of said aluminum electrodes by gaseous species generated in said chamber by a generated plasma which comprises covering said exposed aluminum surfaces on said aluminum susceptor and aluminum showerhead electrodes with a removable protective layer of a ceramic material selected from the group consisting of aluminum nitride, crystalline aluminum oxide, magnesium fluoride, and sintered aluminum oxide without bonding of said ceramic material to said aluminum surface to thereby protect said exposed aluminum surfaces from attack from said gaseous species generated by said plasma while inhibiting cracking of said ceramic material by thermal mismatching with said exposed aluminum surfaces, said aluminum susceptor provided with a ceramic disk on said planar aluminum surface of said aluminum susceptor, and a ceramic collar in peripheral contact with an exposed surface of said ceramic disk, said ceramic collar having a ceramic skirt depending therefrom extending over a sidewall aluminum surface of said aluminum susceptor to thereby inhibit contact of said exposed aluminum surfaces on said aluminum susceptor by said species generated by said plasma.

11. A plasma processing chamber having metal surfaces therein, including a planar metal surface and a sidewall metal surface on a metal susceptor therein, protected from attack by species generated by a plasma generated in said chamber by protective removable ceramic surfaces characterized by good dielectric properties, good thermal conductivity, and good thermal shock resistance, and mounted between said metal surfaces and said plasma, including said planar and sidewall metal surfaces of said metal susceptor, and in contact with said metal surfaces, but not bonded thereto, to thereby protect said planar and sidewall metal surfaces of said metal susceptor from said attack by species in said plasma, while mitigating damage to said protective removable ceramic surfaces from thermal expansion rate mismatch between said metal surfaces and said protective removable ceramic surfaces, said metal susceptor provided with a ceramic disk on said planar metal surface of said metal susceptor, and a ceramic collar in peripheral contact with an exposed surface of said ceramic disk, said ceramic collar having a ceramic skirt depending therefrom to extend over said sidewall metal surface of said metal susceptor to thereby inhibit contact of said metal surfaces on said metal susceptor by said species generated by said plasma.

12. The plasma processing chamber of claim 11 wherein said metal susceptor is covered with a cup-like shell of ceramic material contacting the planar and sidewall surfaces of said metal susceptor to protect said metal susceptor from said gaseous species generated by said plasma.

13. The plasma processing chamber of claim 12 wherein portions of said ceramic shell adjacent said sidewall surfaces of said metal susceptor are further provided with fastening means to urge said ceramic shell against said metal susceptor.

14. A plasma processing chamber capable of generating, in a plasma therein, gaseous species capable of attacking aluminum surfaces in said chamber, said plasma processing chamber having an aluminum susceptor therein for mounting a semiconductor substrate thereon and an aluminum showerhead for introducing processing gases into said chamber, said aluminum susceptor provided with a generally circular ceramic disc with a first generally planar surface facing said aluminum showerhead and also having sidewall surfaces thereon, and a ceramic collar in peripheral contact with an exposed surface of said ceramic disk, said ceramic collar having a ceramic skirt depending therefrom extending over said sidewall surfaces of said aluminum susceptor to thereby inhibit contact of said aluminum susceptor surfaces by said gaseous species generated by said plasma, said aluminum showerhead also having a generally planar surface facing said aluminum susceptor and also having sidewall surfaces thereon, each of said aluminum susceptor and showerhead surfaces having mounted thereon a protective layer of a ceramic material selected from the group consisting of aluminum nitride, crystalline aluminum oxide, magnesium fluoride, and sintered aluminum oxide, without bonding of said ceramic material to said aluminum surface, to thereby protect said aluminum surfaces from attack from said gaseous species generated by said plasma while inhibiting cracking of said ceramic material by thermal mismatching with said aluminum surfaces.

15. The plasma processing chamber of claim 14 wherein said ceramic collar and skirt thereon are further provided with fastening means to urge said collar against said ceramic disc and said aluminum susceptor.

16. The plasma processing chamber of claim 15 wherein said fastening means further comprise an annular groove in the inner surface of said depending skirt at a distance from said collar in excess of the thickness of said aluminum susceptor, and retention means received in said annular groove which contact an opposite surface of said susceptor to urge said collar against said ceramic disc and said aluminum susceptor thereunder.

17. The plasma processing chamber of claim 15 wherein said aluminum susceptor is also protected by a second ceramic disc having a diameter approximately equal to the inner diameter of said ceramic depending skirt and having one surface thereof positioned against the rear surface of said aluminum susceptor facing away from said aluminum showerhead, and said fastening means also retain said second ceramic disc against said aluminum susceptor.

18. The plasma processing chamber of claim 17 wherein said second ceramic disc has a diameter approximately equal to the inner diameter of said ceramic depending skirt, and said fastening means contact a surface of said second ceramic disc facing away from said aluminum susceptor to maintain said second ceramic disc against said susceptor to thereby protect the rear surface of said susceptor facing away from said showerhead.

19. The plasma processing chamber of claim 18 wherein said fastening means further comprise:
   a) an annular groove in the inner surface of said depending skirt at a distance from said collar in excess of the combined thickness of said aluminum susceptor and said second ceramic disc; and
   b) retention means received in said groove which contact an opposite surface of said aluminum susceptor to urge said collar against said ceramic disc and said aluminum susceptor thereunder.

20. The plasma processing chamber of claim 18 wherein said fastening means further comprise:
   a) an annular groove in the inner surface of said depending skirt at a distance from said collar in excess of the thickness of said aluminum susceptor and said second ceramic disc;
   b) one or more tabs on the periphery of said second ceramic disc; and
   c) one or more slots provided in the bottom surface of said depending skirt in communication with said annular groove, and in alignment with said tabs on said second ceramic disc to thereby permit said tabs to be received in said slots and rotated in said annular groove;
to thereby retain said collar against said ceramic disc and said aluminum susceptor thereunder, while also retaining said second ceramic disc against said aluminum susceptor.

21. The plasma processing chamber of claim 18 wherein said fastening means further comprise:
   a) female threads on the inner surface of said depending skirt adjacent an end edge of said skirt; and
   b) matching male threads on an outer edge of said second ceramic disc; to permit said threaded second ceramic disc to be screwed into said depending skirt.

22. A plasma processing chamber capable of generating, in a plasma therein, gaseous species capable of attacking aluminum surfaces in said chamber, said plasma processing chamber having an aluminum susceptor therein for mounting a semiconductor substrate thereon and an aluminum showerhead for introducing processing gases into said chamber;

a) said aluminum susceptor further comprising:
   i) a generally circular aluminum disc having a first generally planar surface facing said aluminum showerhead and also having sidewall surfaces thereon;
   ii) a cup-like shell of ceramic material contacting said planar and sidewall surfaces of said aluminum susceptor to protect said aluminum susceptor from said gaseous species generated by said plasma; and
   iii) fastening apparatus provided with portions of said shell of ceramic material adjacent said sidewall surfaces of said aluminum susceptor to urge said shell of ceramic material against said aluminum susceptor, said fastening apparatus comprising an annular groove in the inner surface of said ceramic shell adjacent said aluminum susceptor sidewalls having a width in excess of the thickness of said aluminum susceptor, and retention means received in said annular groove which contact an opposite surface of said aluminum susceptor to urge said ceramic shell against said planar surface of said aluminum susceptor facing said aluminum showerhead;
b) said aluminum showerhead further comprising:
   i) a generally planar surface facing said aluminum susceptor;
   ii) sidewall surfaces thereon; and
   iii) a protective layer of a ceramic material mounted on said planar and sidewall aluminum showerhead surfaces;
said ceramic material on said aluminum susceptor and said aluminum showerhead selected from the group consisting of aluminum nitride, crystalline aluminum oxide, magnesium fluoride, and sintered aluminum oxide, said ceramic material mounted on said aluminum surfaces on said aluminum susceptor and said aluminum showerhead, without bonding of said ceramic material thereto, to thereby protect said aluminum surfaces from attack from said gaseous species generated by said plasma while inhibiting cracking of said ceramic material by thermal mismatching with said aluminum surfaces.

23. The plasma processing chamber of claim 22 wherein said opposite surface of said aluminum susceptor is also protected by a second ceramic disc having a diameter approximately equal to the inner diameter of said portion of said ceramic shell adjacent said susceptor sidewall, and said retention means contact a surface of said second ceramic disc facing away from said aluminum susceptor to urge said second ceramic disc against said susceptor to thereby protect the rear surface of said susceptor facing away from said showerhead.

24. A plasma processing chamber capable of generating, in a plasma therein, gaseous species capable of attacking aluminum surfaces in said chamber, said plasma processing chamber having an aluminum susceptor therein for mounting a semiconductor substrate thereon and an aluminum showerhead for introducing processing gases into said chamber;
a) said aluminum susceptor further comprising:
   i) a generally circular aluminum disc having a first generally planar surface facing said aluminum showerhead and also having sidewall surfaces thereon;
   ii) a cup-like shell of ceramic material contacting said planar and sidewall surfaces of said aluminum susceptor to protect said aluminum susceptor from said gaseous species generated by said plasma;
   iii) a ceramic disc having a diameter approximately equal to the inner diameter of said portion of said ceramic shell adjacent said aluminum susceptor sidewalls and having one surface thereof positioned against a rear surface of said aluminum susceptor facing away from said aluminum showerhead, said ceramic disc being provided with one or more tabs thereon; and
   iv) fastening apparatus provided with portions of said shell of ceramic material adjacent said sidewall surfaces of said aluminum susceptor to urge said shell of ceramic material against said aluminum susceptor, said fastening apparatus further comprising an annular groove in the inner surface of said portion of said ceramic shell adjacent said aluminum susceptor sidewall at a distance from the inner surface of the top of said ceramic shell in excess of the thickness of said aluminum susceptor, and one or more slots provided in the bottom surface of said ceramic shell in communication with said annular groove, and in alignment with said tabs on said ceramic disc to permit said tabs to be received in said slots and rotated in said annular groove to thereby retain said ceramic shell against the said planar surface of said aluminum susceptor facing said aluminum showerhead, while also retaining said ceramic disc against said aluminum susceptor;
b) said aluminum showerhead further comprising:
   i) a generally planar surface facing said aluminum susceptor;
   ii) sidewall surfaces thereon; and
   iii) a protective layer of a ceramic material mounted on said planar and sidewall aluminum showerhead surfaces;
said ceramic material on said aluminum susceptor and said aluminum showerhead selected from the group consisting of aluminum nitride, crystalline aluminum oxide, magnesium fluoride, and sintered aluminum oxide, said ceramic material mounted on said aluminum surfaces on said aluminum susceptor and said aluminum showerhead, without bonding of said ceramic material thereto, to thereby protect said aluminum surfaces from attack from said gaseous species generated by said plasma while inhibiting cracking of said ceramic material by thermal mismatching with said aluminum surfaces.

25. The plasma processing chamber of claim 24 wherein said aluminum susceptor is further provided with openings therein to assist in raising a semiconductor substrate thereon and ceramic sleeves are received in said openings to line said openings to protect the aluminum surfaces of said openings holes from said gaseous species generated by said plasma.

26. The plasma processing chamber of claim 25 wherein said ceramic sleeves received in said openings in said aluminum susceptor each have a flange on one end thereon received in an enlarged counterbore in one surface of said aluminum susceptor.

27. The plasma processing chamber of claim 24 wherein said aluminum showerhead is provided with a ceramic disk on its surface facing said aluminum susceptor and having openings therein to permit gases to enter said processing chamber; and a ceramic collar in peripheral contact with the exposed surface of said ceramic disk, said ceramic collar having a skirt thereon extending up over said aluminum sidewall surfaces of said aluminum showerhead to thereby inhibit contact of said aluminum showerhead surfaces by said gaseous species generated by said plasma.

28. The plasma processing chamber of claim 27 wherein said ceramic collar and skirt thereon are further provided with fastening means to urge said ceramic collar against said ceramic disc and said aluminum showerhead.

29. A system for protecting the metal surfaces of a metal susceptor, including a planar metal surface and a sidewall metal surface on said metal susceptor, from attack by species generated by a plasma generated in a plasma processing chamber, comprising removable ceramic members having protective ceramic surfaces thereon characterized by good dielectric properties, good thermal conductivity, and good thermal shock resistance, and capable of being mounted between said metal surfaces of said metal susceptor and said plasma, including said planar metal surface and said sidewall metal surface on said metal susceptor, and in contact with said metal surfaces, but not bonded thereto, to thereby protect said planar and sidewall metal surfaces of said metal susceptor from said attack by species in said plasma, while mitigating damage to said protective ceramic surfaces from thermal expansion rate mismatch between said metal surfaces and said ceramic surfaces, said removable ceramic members including a ceramic disk mountable on said planar metal surface of said metal susceptor, and a ceramic collar in peripheral contact with an exposed surface of said ceramic disk, said ceramic collar having a ceramic skirt depending therefrom extending over said sidewall metal surface of said metal susceptor to thereby inhibit contact of said metal surfaces on said metal susceptor by said species generated by said plasma.

30. The system of claim 29 which further includes ceramic members having protective ceramic surfaces thereon, characterized by good dielectric properties, good thermal conductivity, and good thermal shock resistance, and capable of being mounted between metal surfaces of a metal showerhead and said plasma, including a planar metal surface and a sidewall metal surface on said metal showerhead, and in contact with said metal surfaces of said metal showerhead, but not bonded thereto, to thereby protect said planar and sidewall metal surfaces of said metal showerhead from said attack by species in said plasma, while mitigating damage to said protective ceramic surfaces from thermal expansion rate mismatch between said metal surfaces on said metal showerhead and said protective ceramic surfaces.

* * * * *